(12) United States Patent
Seigler et al.

(10) Patent No.: US 7,050,274 B2
(45) Date of Patent: May 23, 2006

(54) MULTILAYER PERMANENT MAGNET FILMS

(75) Inventors: Michael A. Seigler, Pittsburgh, PA (US); Isabel G. Trindade, Pittsburgh, PA (US); Paul E. Anderson, Eden Prairie, MN (US)

(73) Assignee: Seagate Technology LLC

( * ) Notice: Subject to any disclaimer, the term of this patent is extended or adjusted under 35 U.S.C. 154(b) by 294 days.

(21) Appl. No.: 10/012,829

(22) Filed: Dec. 10, 2001

(65) Prior Publication Data

US 2002/0044393 A1 Apr. 18, 2002

Related U.S. Application Data

(60) Provisional application No. 60/276,074, filed on Mar. 15, 2001.

(51) Int. Cl.
*G11B 5/39* (2006.01)
*G11B 5/127* (2006.01)

(52) U.S. Cl. .................... 360/324.11; 360/327.23; 360/327.31; 360/324.12

(58) Field of Classification Search ........... 360/324, 360/324.1, 324.11, 324.12, 324.2, 327.23, 360/327.31, 327.1, 327.2; 324/252, 207.21; 338/32 R, 32 H
See application file for complete search history.

(56) References Cited

U.S. PATENT DOCUMENTS

| | | | |
|---|---|---|---|
| 5,390,061 A | 2/1995 | Nakatani et al. | |
| 5,465,185 A | 11/1995 | Heim et al. | |
| 5,528,440 A | 6/1996 | Fontana et al. | |
| 5,565,266 A | 10/1996 | Hatwar et al. | |
| 5,574,605 A | 11/1996 | Baumgart et al. | |
| 5,583,727 A | 12/1996 | Parkin | |
| 5,701,222 A | 12/1997 | Gill et al. | |
| 5,708,358 A | 1/1998 | Ravipati | |
| 5,800,931 A | 9/1998 | Lee et al. | |
| 5,818,685 A | 10/1998 | Thayamballi et al. | |
| 5,846,648 A | 12/1998 | Chen et al. | |
| 5,879,783 A * | 3/1999 | Chang et al. | 428/141 |
| 5,917,400 A | 6/1999 | Fujikata et al. | |
| 5,936,812 A * | 8/1999 | Terunuma et al. | 360/317 |
| 5,998,040 A * | 12/1999 | Nakatani et al. | 428/611 |
| 6,031,692 A * | 2/2000 | Kawawake et al. | 360/324.12 |
| 6,084,405 A | 7/2000 | Suzuki | |
| 6,132,863 A | 10/2000 | Song et al. | |
| 6,134,091 A | 10/2000 | Toki et al. | |
| 6,143,388 A * | 11/2000 | Bian et al. | 428/65.3 |
| 6,150,015 A | 11/2000 | Bertero et al. | |

(Continued)

*Primary Examiner*—Brian E. Miller
(74) *Attorney, Agent, or Firm*—Pietragallo, Bosick & Gordon LLP; Robert P. Lenart, Esq.; Alan G. Towner, Esq.

(57) ABSTRACT

Multilayer permanent magnet films comprising at least two permanent magnet layers separated by an interlayer are disclosed. In one embodiment, the multilayer permanent magnet film includes an interlayer deposited on a first permanent magnet layer, a seed layer deposited on the interlayer, and a second permanent magnet layer deposited on the seed layer. The permanent magnet layers may comprise a material such as CoPt, while the seed layer may comprise a material such as TiW. The interlayer may comprise a material such as Ta. The multilayer permanent magnet films possess favorable properties such as high magnetic coercivity ($H_c$) and high remnant magnetization ($M_R$) at thicknesses which yield high magnetic fields. The films may be used in applications such as current perpendicular to the plane (CPP) magnetic sensors in which the multilayer permanent magnet film is used to magnetically bias the sensor.

17 Claims, 4 Drawing Sheets

U.S. PATENT DOCUMENTS

| | | |
|---|---|---|
| 6,156,404 A | 12/2000 | Ross et al. |
| 6,248,416 B1 | 6/2001 | Lambeth et al. |
| 6,271,998 B1 * | 8/2001 | Coehoorn et al. ....... 360/324.2 |
| 6,400,535 B1 | 6/2002 | Shimazawa et al. |
| 6,424,508 B1 * | 7/2002 | Tadokoro et al. ........ 360/324.2 |
| 6,449,135 B1 * | 9/2002 | Ding et al. ............ 360/327.31 |
| 6,462,920 B1 * | 10/2002 | Karimi ................. 360/327.31 |
| 6,500,567 B1 | 12/2002 | Bertero et al. |
| 6,501,678 B1 | 12/2002 | Lenssen et al. |
| 6,511,761 B1 * | 1/2003 | Tanahashi et al. ..... 428/694 TS |
| 6,517,956 B1 * | 2/2003 | Chen .......................... 428/668 |
| 6,667,118 B1 * | 12/2003 | Chang et al. ........ 428/694 TM |
| 6,686,069 B1 * | 2/2004 | Okuyama et al. ...... 428/694 TS |
| 2001/0012187 A1 | 8/2001 | Lai et al. |

* cited by examiner

MULTILAYER PERMANENT MAGNET FILMS

CROSS REFERENCE TO RELATED APPLICATION

This application claims the benefit of U.S. Provisional Patent Application Ser. No. 60/276,074 filed Mar. 15, 2001.

FIELD OF THE INVENTION

The present invention relates to permanent magnet films, and more particularly relates to multilayer permanent magnet films that may be used in magnetic recording systems such as current perpendicular to the plane (CPP) magnetic sensors.

BACKGROUND INFORMATION

Magnetic films of various compositions have been developed for different applications. For example, permanent magnet films may be used in magnetic recording systems. However, conventional permanent magnet films do not typically possess a satisfactory combination of high magnetic coercivity ($H_c$) and high remnant magnetization ($M_r$) at thicknesses that yield sufficiently high magnetic fields for use in applications such as stabilization of magnetic sensors.

The types of sensors typically used today for magnetic recording are categorized as current-in-plane (CIP) sensors. In CIP sensors, the current flows parallel to the plane of stacked films in the sensor. One possible sensor type for future high density recording is the current perpendicular to the plane (CPP) sensor. In CPP designs, the current flows perpendicular to the plane of the stacked films.

The CPP sensors are of interest because of their potentially larger giant magnetoresistance (GMR) or change in resistance when a magnetic field is applied. The larger GMR comes about because all of the current needs to pass through every ferromagnetic/non-magnetic/ferromagnetic (FM/NM/FM) series of interfaces and none of the current is shunted around the interfaces. Since every film and interface leads to additional resistance, it is desired to have all of the films and interfaces contribute to the overall change in resistance. A GMR multilayer consists of a series of FM/NM bilayers. Every series of interfaces provides an opportunity for interfacial spin-dependent scattering and every ferromagnetic material provides an opportunity for bulk spin-dependent bulk.

CPP GMR multilayer sensors may be biased by a permanent magnet adjacent to the stacked films in order to orient magnetizations of adjacent ferromagnetic layers in the desired directions. However, currently available permanent magnet materials do not possess optimal properties such as high $H_c$ and high $M_r$ at sufficient film thicknesses to provide adequate biasing magnetic fields.

The present invention has been developed in view of the foregoing and to address other deficiencies of the prior art.

SUMMARY OF THE INVENTION

An aspect of the present invention is to provide a multilayer permanent magnet film comprising first and second permanent magnet layers, and an interlayer between the first and second permanent magnet layers which reduces local epitaxy between the first and second permanent magnet layers.

Another aspect of the present invention is to provide a magnetic read sensor including a CPP magnetic sensor and a multilayer permanent magnet film biasing the CPP magnetic sensor.

A further aspect of the present invention is to provide a method of making a multilayer permanent magnet film. The method includes the steps of providing a first permanent magnet layer, depositing an interlayer on the first permanent magnet layer, depositing a seed layer on the interlayer, and depositing a second permanent magnet layer on the seed layer.

These and other aspects of the present invention will be more apparent from the following description.

DETAILED DESCRIPTION

Figure 1:
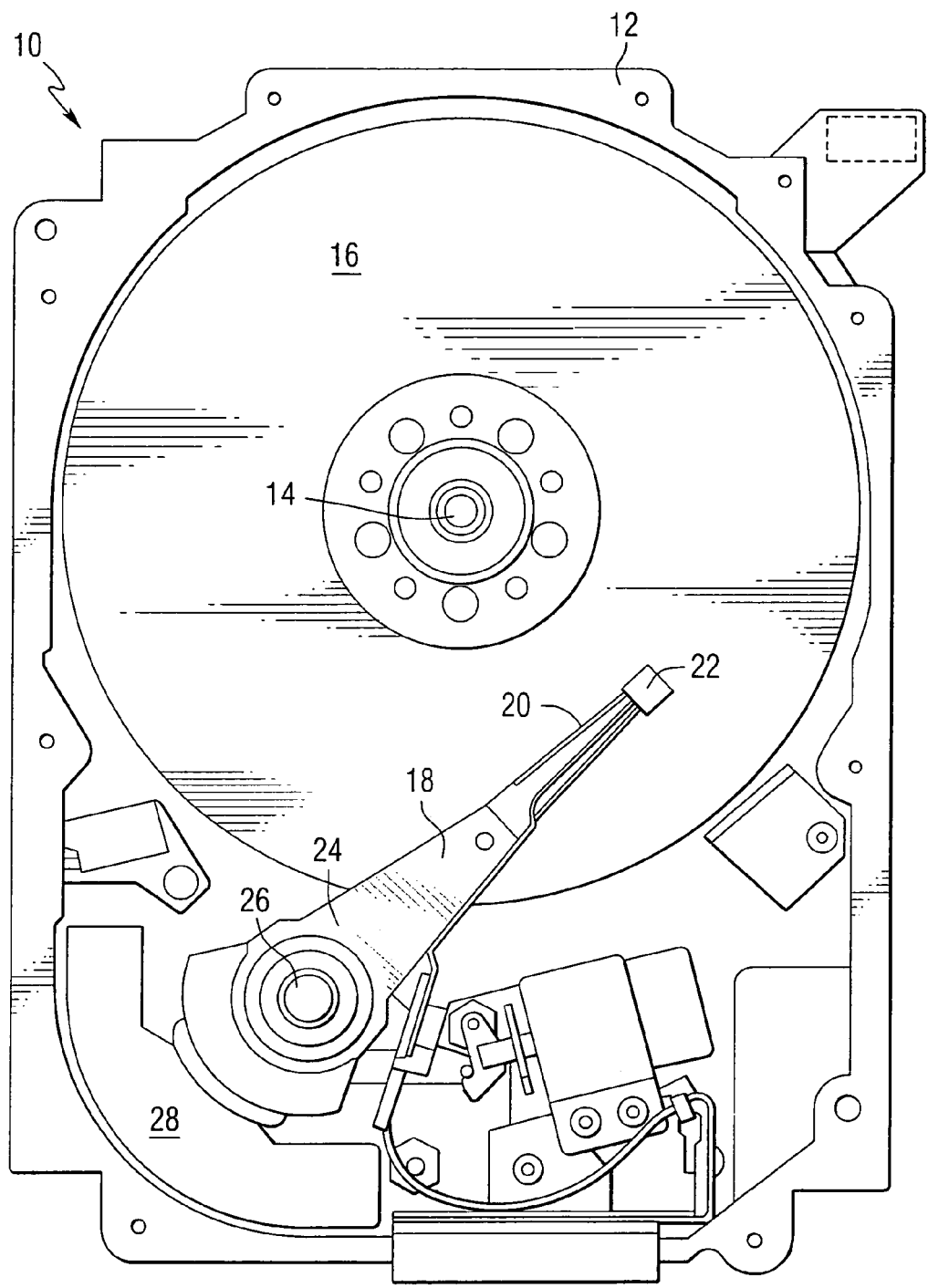
FIG. 1 is a pictorial representation of a disc drive that can include a magnetic sensor biased by a multilayer permanent magnet film in accordance with an embodiment of the present invention.

FIG. 1 is a pictorial representation of a disc drive 10 that can utilize multilayer permanent magnet films in accordance with the present invention. The disc drive includes a housing 12 (with the upper portion removed and the lower portion visible in this view) sized and configured to contain the various components of the disc drive. The disc drive includes a spindle motor 14 for rotating at least one magnetic storage medium 16 within the housing, in this case a magnetic disc. At least one arm 18 is contained within the housing 12, with each arm 18 having a first end 20 with a recording and/or read head or slider 22, and a second end 24 pivotally mounted on a shaft by a bearing 26. An actuator motor 28 is located at a second end 24 of the arm, for pivoting the arm 18 to position the head 22 over a desired sector of the disc 16. The actuator motor 28 is regulated by a controller that is not shown in this view and is well known in the art.

Figure 2:
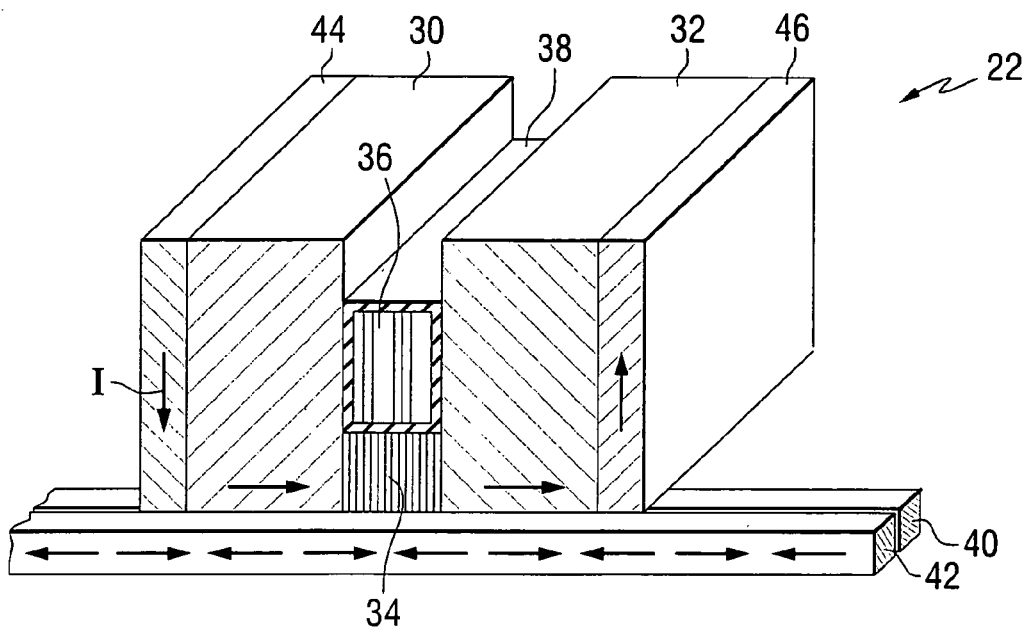
FIG. 2 is a partially schematic isometric sectional view of a CPP magnetic sensor biased by a multilayer permanent magnet film in accordance with an embodiment of the present invention.

FIG. 2 is a cross-sectional view of a portion of a read head 22 constructed in accordance with this invention. The read head 22 includes first and second conductive shields 30 and 32 positioned on opposite sides of a read sensor 34. The read sensor 34 may be a giant magnetoresistance type sensor. However, other type sensors such as magnetoresistance (MR) sensors, tunnel magnetoresistance (TMR) sensors or the like may be used with the invention.

The read head 22 is configured to fly adjacent to the magnet recording medium 16, which has a plurality of tracks illustrated by tracks 40 and 42. The tracks 40 and 42 contain magnetic domains capable of storing digital information according to the polarity of magnetization thereof. The magnetic domains are illustrated by arrows, shown in track 40 in FIG. 2. Conductors 44 and 46 are positioned adjacent to shields 30 and 32, respectively, and are used to supply a constant current I that flows through the shields 30 and 32 and the read sensor 34 in a current perpendicular to the plane (CPP) direction. When the read sensor 34 is subjected to an external magnetic field, the resistance of the GMR stack that forms the read sensor 34 changes, thereby changing the voltage across the stack. The stack voltage is then used to produce an output voltage. Alternatively, a voltage may be applied and the current measured.

The read sensor 34 may include alternating layers of ferromagnetic and non-magnetic materials structured, as shown, to form a current perpendicular to the plane (CPP) type sensor. The read sensor may typically include from 2 to 50 FM/NM bilayers. The ferromagnetic material may be, for example, CoFe, NiFe, CoNiFe, Co and/or CoNi having a thickness of from 5 to 100 Å for each layer. The non-magnetic material may be, for example, Cu, Ag and/or Au having a thickness from 5 to 100 Å for each layer. The total thickness of the read sensor 34 may be from 15 to 1,000 Å.

In the quiescent state, the magnetization of adjacent layers in a CPP-GMR multilayer may be oriented 180° with respect to each other, due to Ruderman-Kittel-Kasuya-Yoshida (RKKY) coupling. For example, this orientation may occur in a CPP-GMR multilayer 34 as illustrated in FIG. 2 made of fifteen (15) bilayers of (Cu 18 Å/CoFe 10 Å), with the Cu thickness chosen such that the coupling between the CoFe layers is antiferromagnetic. If this type of sensor is used in a magnetic recording head, it will need to be biased such that it operates in a linear region in order to use detection schemes that depend on linearity.

One way of biasing a GMR multilayer sensor is to place a permanent magnet nearby, such that the magnetizations of adjacent ferromagnetic layers are 90° with respect to each other. This would be similar to applying a DC magnetic field to the Cu/CoFe CPP-GMR multilayer sensor described above. The sensor could then be used to sense the field from the magnetic recording media. The GMR multilayer may thus be biased into the linear operating region using a multilayer permanent magnet film of the present invention.

Figure 3:
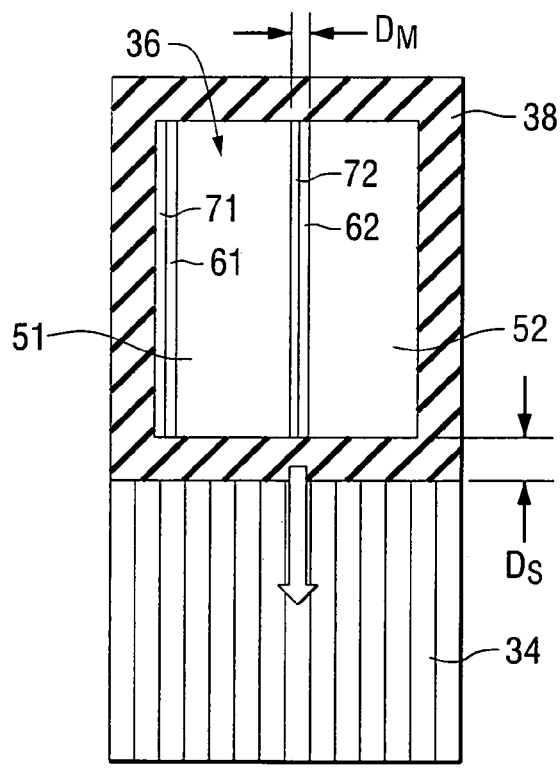
FIG. 3 is an enlarged side view of the CPP magnetic sensor and multilayer permanent magnet film of FIG. 2.

In accordance with an embodiment of the present invention as shown in FIGS. 2 and 3, a multilayer permanent magnet film 36 is positioned adjacent to the read sensor 34. An insulating material 38 may encase the multilayer permanent magnet film 36. The insulating material 38 may be made of any suitable material such as alumina, $SiO_2$ or SiN having a thickness of from 10 to 1,000 Å.

The permanent magnet 36 design illustrated in FIGS. 2 and 3 is selected in order to adequately bias the GMR multilayer sensor 34. If the sensor 34 is either over or under biased, the signal may become non-linear and create a loss of amplitude, signal asymmetry and detection problems. However, over biasing the head may be the preferable situation due to available techniques for adjusting the biasing point towards lower fields. Micromagnetic modeling of the read-head shown in FIG. 2 indicates that a permanent magnet with a remnant magnetization of ~700 emu/cc and a thickness of ~1,000 Å will be needed to bias the sensor into a linear operating region. In addition to these requirements, a $H_c$ of at least 2000 Oe is desired for magnetic stability. Furthermore, sufficient corrosion resistance is needed for processing. Unfortunately, high $H_c$, high $M_r$ and a thickness great enough to produce a sufficient magnetic flux for biasing the sensor 34 are difficult to achieve in a single material.

As shown most clearly in FIG. 3, the thick film multilayer permanent magnet 36 includes a first permanent magnet layer 51 and a second permanent magnet layer 52. The permanent magnet layers 51 and 52 are separated by a seed layer 62 and an interlayer 72 of the present invention. In the embodiment shown in FIG. 3, the first permanent magnet layer 51 is adjacent to another seed layer 61 and interlayer 71.

The permanent magnet layers 51 and 52 may comprise CoX, where X can be, for example, Pt, Ta, Cr, B or any combination thereof. For instance, the permanent magnet layers 51 and 52 may comprise CoPt wherein the Co ranges from about 60 to about 90 atomic percent, and the Pt ranges from about 10 to about 40 atomic percent. As a particular example, the permanent magnet layers 51 and 52 may comprise 78 atomic percent Co and 22 atomic percent Pt.

The seed layers 61 and 62 may comprise TiW, Cr, CrW and/or TiCr. For example, the seed layers 61 and 62 may comprise TiW having up to about 20 atomic percent Ti and from about 80 to about 100 atomic percent W. As a particular example, the seed layers 61 and 62 may comprise 5 atomic percent Ti and 95 atomic percent W.

The interlayers 71 and 72 may comprise an amorphous material or materials that break up local epitaxial growth and do not promote unwanted texture in the subsequently deposited films. Suitable interlayer materials include Ta, Zr and/or Nb. Tantalum is a particularly suitable material for the interlayers 71 and 72 since Ta also increases the texture in the films.

In accordance with the present invention, the interlayer 72 reduces local epitaxy between the permanent magnet layers 51 and 52. As used herein, the phrase "reduces local epitaxy" means that the films deposited after the interlayer will not grow epitaxially on the films deposited before the interlayer. The amount of local epitaxy can be measured by taking a transmission electron microscope (TEM) image of the permanent magnet multilayer to see if the grains in the second layer line up with the grains in the first layer. If they do not line up exactly, the local epitaxy has been broken to some degree. An important indication that the local epitaxy has been broken is that the coercivity of the bilayer permanent magnet is larger than the coercivity of a single layer permanent magnet that has a thickness equal to the sum of the two permanent magnet layers in the bilayer permanent magnet.

The interlayer 72 may also increase texture in the permanent magnet layers 51, 52 and/or seed layers 71, 72. As used herein, "increased texture" means that a larger portion of the film has the desired texture. The desired texture is the texture that has the highest coercivity. If more of the permanent magnet film has the high coercivity texture, then there will be less of the film that has a low coercivity texture. The desired texture should also have an in-plane anisotropy. The amount of texture can be measured by standard x-ray diffraction techniques.

As shown in FIG. 3, the first and second permanent magnet layers 51 and 52 are separated by a distance $D_M$ which corresponds to the combined thicknesses of the seed layer 62 and interlayer 72. The first and second permanent magnet layers 51 and 52 are separated from the read sensor 34 by a distance $D_S$ which corresponds to the thickness of the insulating material 38. In order to produce a substantially uniform magnetic field on the read sensor 34, the distance $D_M$ between the first and second permanent magnet layers 51 and 52 may be less than the distance $D_S$ between the permanent magnet layers 51, 52 and the read sensor 34. The ratio of $D_S$:$D_M$ may range from about 0.5:1 to about 10:1 or higher. For example, the distance $D_M$ may be from about 10 to about 500 Å, typically from about 50 to about 100 Å. The distance $D_S$ may be from about 5 to about 500 Å, typically from about 50 to about 100 Å.

Figure 4:
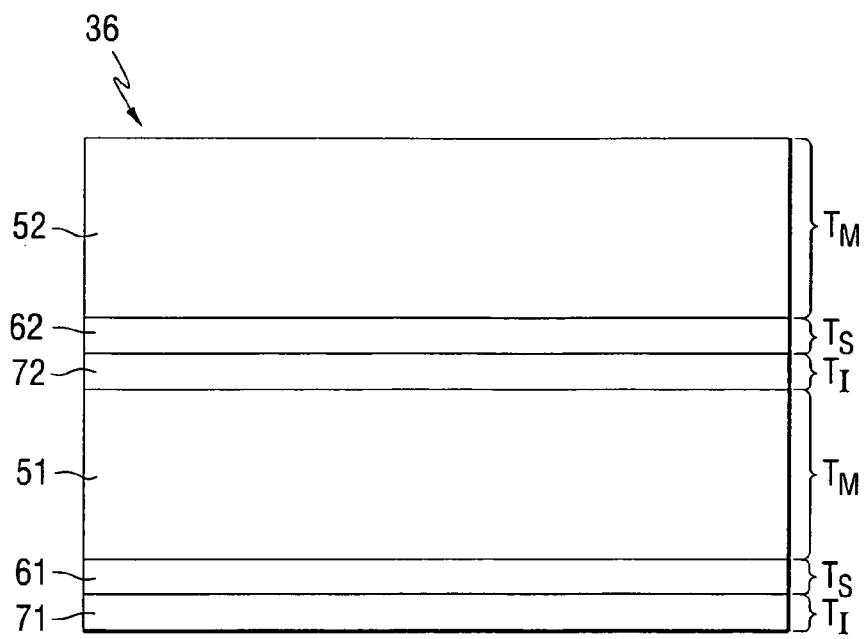
FIG. 4 is a partially schematic side view of a multilayer permanent magnet film in accordance with an embodiment of the present invention.

As shown in FIG. 4, the thickness of each permanent magnet layer 51 and 52 is designated as $T_M$. The thickness $T_M$ may typically range from about 100 to about 1,000 Å, for example, from about 250 to about 750 Å. As a particular example, the thickness $T_M$ may be about 500 Å, resulting in a total thickness of 1,000 Å for the permanent magnet layers 51 and 52. The thickness $T_M$ of each permanent magnet layer 51 and 52 is the same in the embodiment shown in FIG. 4. However, the permanent magnet layers may have different thicknesses if desired. The total thickness of the permanent magnet layers 51 and 52 is typically greater than 500 Å, for example, greater than 800 Å.

As shown in FIG. 4, the seed layers 61 and 62 have thicknesses designated as $T_S$. The thickness $T_S$ may range from about 5 to about 200 Å, typically from about 20 to about 50 Å. As a particular example, the thickness $T_S$ may be about 30 Å. Although the seed layers 61 and 62 shown in FIG. 4 have the same thicknesses $T_S$, the seed layers may have different thicknesses if desired.

As further shown in FIG. 4, the interlayers 71 and 72 have thicknesses designated as $T_I$. The thickness $T_I$ may range from about 5 to about 200 Å, typically from about 20 to about 50 Å. As a particular example, the thickness $T_I$ may be about 30 Å. The thickness $T_I$ of each interlayer 71 and 72 may be the same, as shown in FIG. 4, or may be different.

The read sensor 34 and multilayer permanent magnet film 36 shown in FIGS. 2 and 3 may be made as follows. The CPP-GM sensor may be sputter deposited and then patterned using standard lithography and ion milling techniques. The wafer is then patterned to designate the location of the permanent magnet, followed by milling to create a cavity for the permanent magnet behind the sensor. The permanent magnet is deposited by standard techniques such as sputtering and then lifted off the wafer, leaving the permanent magnet behind the sensor.

Although the multilayer permanent magnet films 36 and 80 shown in FIGS. 2–4 include two (2) permanent magnet layers 51 and 52, additional permanent magnet layers may be incorporated in the present multilayer permanent magnet films. For example, from three (3) to ten (10) or more permanent magnet layers may be included.

Figure 5:
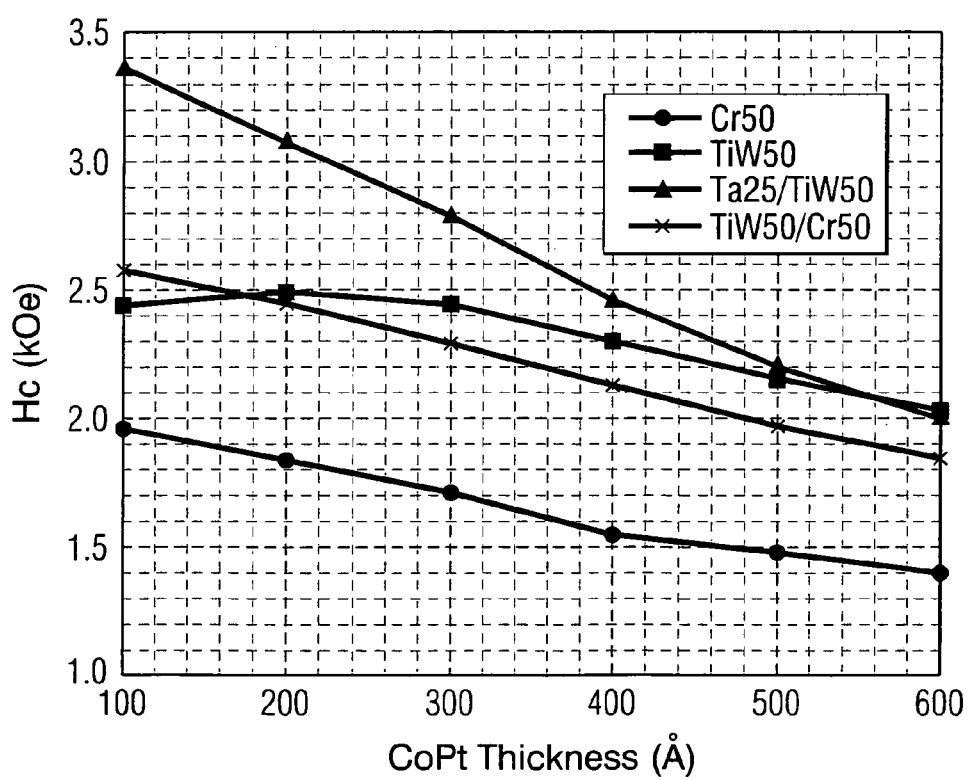
FIG. 5 is a graph illustrating that $H_c$ decreases with increasing CoPt magnetic layer thicknesses.

A permanent magnet material composition of Co78Pt22 (at.%) was evaluated. This material possesses favorable properties except that the coercivity decreases with increased thickness. As shown in FIG. 5, $H_c$ decreases to less than 1500 Oe at a thickness of 1,000 Å. The decrease in $H_c$ results due to the larger grains in the relatively thick film. Although attempts have been made to overcome the decrease in $H_c$ vs. thickness by depositing multiple layers such as TiW50/CoPt500/TiW50/CoPt500, this approach has not been shown to work in the past and has resulted in an $H_c$ no larger than a TiW50/CoCrPt1000 film.

The present invention provides a method for making a multilayer system with a larger $H_c$ than a single layer film with the same total permanent magnet thickness. Although not intending to be bound by any particular theory, it is believed that the reason the TiW50/CoPt500 /TiW50/CoPt500 film does not have a larger $H_c$ than TiW50/CoPt1000 is that when the second TiW layer grows on top of the first CoPt500 layer, it grows with the same large grains that the CoPt500 has already achieved. It is believed that the same columnar growth continues through the TiW layer and the second CoPt film picks up the large grain structure where the first CoPt500 layer left off.

In accordance with an embodiment of the present invention, the interlayer 72 film is inserted between the two permanent magnet layers 51 and 52. Since the interlayer 72 is not a good lattice match with either the, e.g., TiW seed layer 62 or the, e.g., CoPt permanent magnet layers 51 and 52, the columnar grain growth can be broken up. When the second permanent magnet layer 52 is deposited, it will start with small grains. For example, since Ta is not a good lattice match with the CoPt, it induces small grains and may also improve the texture of the films grown on top of it.

Figure 6:
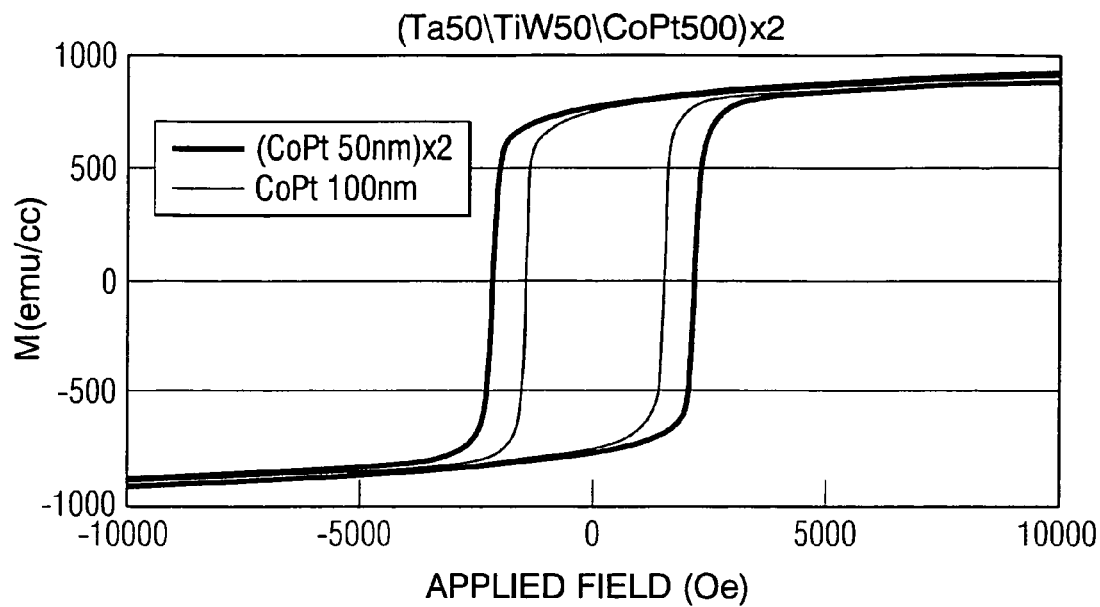
FIG. 6 is a graph of magnetization (M) versus applied field for a multilayer permanent magnet film of the present invention having a Ta interlayer separating two CoPt magnetic layers, in comparison with a single CoPt magnetic layer.

FIG. 6 shows the effect of depositing a Ta50/TiW50/CoPt500/Ta50/TiW50/CoPt500 bilayer compared to depositing a single permanent magnet layer of Ta50/TiW50/CoPt1000. By depositing the bilayer, $H_c$ increased from 1450 Oe to 2175 Oe, $M_r$ increased from 761 emu/cc to 776 emu/cc and the squareness increased from 0.80 to 0.84.

Figure 7:
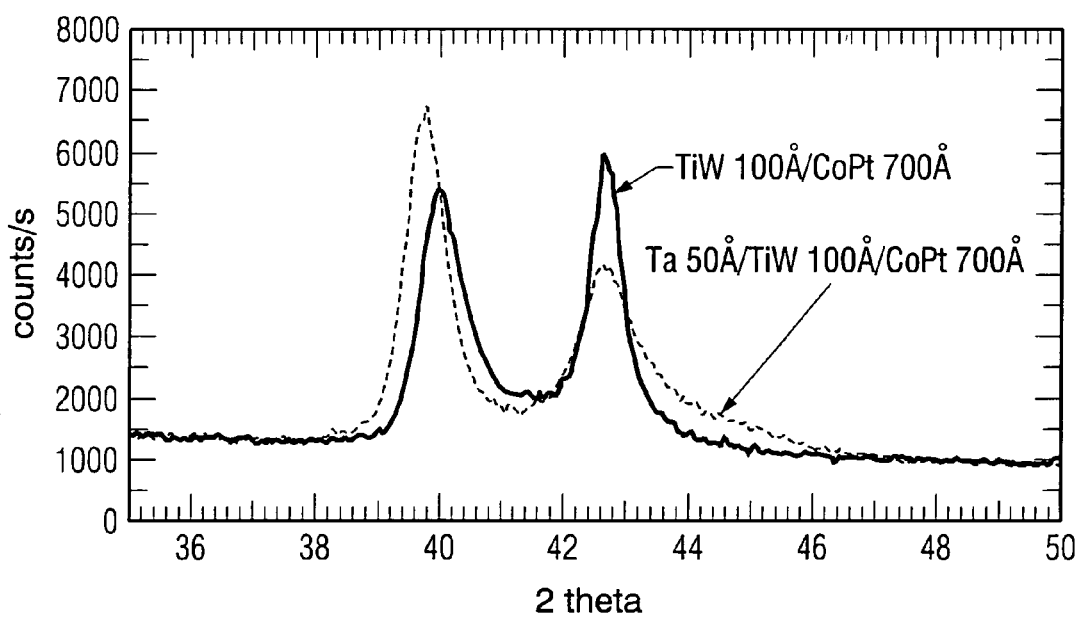
FIG. 7 is an x-ray diffraction pattern, illustrating the change in texture which occurs when a Ta interlayer of the present invention is used in a TiW/CoPt structure.

The x-ray diffraction pattern of FIG. 7 indicates that the Ta seed layer reduces perpendicularly oriented (00_2) texture in CoPt and increases (110) texture in TiW, which in turn increases the in-plane oriented (10_0) texture in the CoPt film. The (10_0) texture has the desired in-plane texture, and the film with this texture has a large in-plane coercivity. Other films may also serve the same purpose, including metals and insulators. If insulators were to have a similar effect of breaking up the grain growth, they could also assist in keeping current from flowing from the sensor into the permanent magnet, in case the insulating layer between the sensor and the multilayer permanent magnet fails.

Due to the importance of the permanent magnet having a large $H_c$ so that the varying magnetization of the nearby sensor does not eventually demagnetize the permanent magnet, the improved magnetic performance of the present multilayer permanent magnet films may be important to the successful implementation of CPP-GMR read-heads. Furthermore, the multilayer permanent magnet films may be useful in other applications where the decrease in $H_c$ versus thickness may need to be overcome, including other readback sensor designs.

Whereas particular embodiments of this invention have been described above for purposes of illustration, it will be evident to those skilled in the art that numerous variations of the details of the present invention may be made without departing from the invention as defined in the appended claims.

The invention claimed is:

1. A multilayer permanent magnet film comprising:

first and second permanent magnet layers;

a first interlayer between the first and second permanent magnet layers which reduces local epitaxy between the first and second permanent magnet layers;

a seed layer between the first interlayer and at least one of the first and second permanent magnet layers, wherein the first interlayer is deposited on the first permanent magnet layer, the seed layer is deposited on the first interlayer, and the second permanent magnet layer is deposited on the seed layer; and a third permanent magnet layer separated from the second permanent magnet layer by a second interlayer.

2. The multilayer permanent magnet film of claim 1, wherein the first interlayer reduces local epitaxy between the seed layer and the at least one first and second permanent magnet layers.

3. The multilayer permanent magnet film of claim 1, wherein the first permanent magnet layer is deposited on a second seed layer.

4. The multilayer permanent magnet film of claim 3, wherein the second seed layer is deposited on the second permanent magnet layer.

5. The multilayer permanent magnet film of claim 1, further comprising a second seed layer between the second interlayer and the third permanent magnet layer.

6. The multilayer permanent magnet film of claim 1, wherein the first and second permanent magnet layers comprise CoPt, CoTa, CoCr, CoB or combinations thereof, and the seed layer comprises TiW, Cr, CrW and/or TiCr.

7. The multilayer permanent magnet film of claim 6, wherein the first interlayer comprises Ta, Zr and/or Nb.

8. The multilayer permanent magnet film of claim 6, wherein the first interlayer comprises Ta.

9. The multilayer permanent magnet film of claim 1, wherein the first interlayer comprises Ta, Zr and/or Nb.

10. The multilayer permanent magnet film of claim 1, wherein the first interlayer comprises Ta.

11. The multilayer permanent magnet film of claim 1, wherein the first interlayer increases texture of the second permanent magnet layer.

12. The multilayer permanent magnet film of claim 1, wherein the first interlayer has a thickness of from about 5 to about 200 Å.

13. The multilayer permanent magnet film of claim 1, wherein each of the first and second permanent magnet layers has a thickness of from about 100 to about 1,000 Å.

14. The multilayer permanent magnet film of claim 1, wherein the total thickness of the permanent magnet layers is greater than 500 Å.

15. The multilayer permanent magnet film of claim 14, wherein the film has a coercivity of greater than 2000 Oe.

16. The multilayer permanent magnet film of claim 14, wherein the film has a remnant magnetization of greater than 700 emu/cc.

17. A multilayer permanent magnet film comprising:
first and second permanent magnet layers;
a first interlayer between the first and second permanent magnet layers;
a seed layer between the first interlayer and at least one of the first and second permanent magnet layers, wherein the first interlayer is deposited on the first permanent magnet layer, the seed layer is deposited on the first interlayer, and the second permanent magnet layer is deposited on the seed layer; and
a third permanent magnet layer separated from the second permanent magnet layer by a second interlayer.

* * * * *